(12) United States Patent
Komura et al.

(10) Patent No.: US 7,663,175 B2
(45) Date of Patent: Feb. 16, 2010

(54) SEMICONDUCTOR INTEGRATED CIRCUIT DEVICE

(75) Inventors: Kazufumi Komura, Kasugai (JP); Takayoshi Nakamura, Kasugai (JP); Keiichi Fujimura, Kasugai (JP); Masahito Hirose, Kasugai (JP); Keigo Nakashima, Kasugai (JP); Masaki Nagato, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 374 days.

(21) Appl. No.: 11/442,152

(22) Filed: May 30, 2006

(65) Prior Publication Data

US 2007/0195946 A1      Aug. 23, 2007

(30) Foreign Application Priority Data

Feb. 17, 2006    (JP)    ............... 2006-040340

(51) Int. Cl.
*H01L 27/108* (2006.01)
*H01L 29/94* (2006.01)

(52) U.S. Cl. ............... 257/307; 257/303; 257/306; 257/308; 257/304; 257/309; 257/532; 257/908; 257/E29.01; 257/E29.058; 257/E29.065; 257/758; 257/E21.008; 438/253; 361/306.1; 361/306.2

(58) Field of Classification Search ............... 257/303, 257/306–309, 532, 908, E29.01, E29.058, 257/E29.065, 758, 301, 302, 304, 305, E21.008; 361/662, 766, 791, 792, 306.2, 306.1; 438/253
See application file for complete search history.

(56) References Cited

U.S. PATENT DOCUMENTS

| | | | | |
|---|---|---|---|---|
| 6,100,591 A * | 8/2000 | Ishii | ............... | 257/773 |
| 6,429,474 B1* | 8/2002 | Gambino et al. | ............... | 257/296 |
| 6,570,210 B1* | 5/2003 | Sowlati et al. | ............... | 257/307 |
| 6,949,781 B2* | 9/2005 | Chang et al. | ............... | 257/296 |
| 7,196,363 B2* | 3/2007 | Montagnana | ............... | 257/207 |
| 2004/0031982 A1* | 2/2004 | Devries et al. | ............... | 257/307 |
| 2005/0259379 A1* | 11/2005 | Bely et al. | ............... | 361/306.1 |

FOREIGN PATENT DOCUMENTS

| | | |
|---|---|---|
| JP | 2001-177056 | 6/2001 |
| JP | 2002-324841 | 11/2002 |
| JP | 2003-249559 | 9/2003 |
| JP | 2004-241762 | 8/2004 |

* cited by examiner

*Primary Examiner*—Jerome Jackson, Jr.
*Assistant Examiner*—David Z Chen
(74) *Attorney, Agent, or Firm*—Westerman, Hattori, Daniels & Adrian, LLP

(57) ABSTRACT

A semiconductor integrated circuit device provided with a plurality of power supply wire layers including a first potential power supply wire and a second potential power supply wire formed in different layers. At least one capacitor contact wire extends from one of the first and second potential power supply wires toward the other one of the first and second potential power supply wires so as to form a capacitor between each capacitor contact wire and its surrounding wires.

6 Claims, 15 Drawing Sheets

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-040340, filed on Feb. 17, 2006, the entire contents of which are incorporated herein by reference.

BACKGROUND OF THE INVENTION

The present invention relates to a semiconductor integrated circuit device including decoupling capacitors for reducing power supply noise.

In a semiconductor integrated circuit device, decoupling capacitors may be formed between power supply wires to reduce power supply noise. A decoupling capacitor can be formed with a gate oxide film. However, an increase in standby current, which results from gate leak current, cannot be ignored. Accordingly, decoupling capacitors are formed by using capacitors between power supply wires.

Various examples of decoupling capacitors formed between power supply wires have been proposed.

Japanese Laid-Open Patent Publication No. 2002-324841 describes a contact wire for connecting high potential power supply wires and a contact wire for connecting lower potential power supply wires. A capacitor is formed on an interlayer insulative film located between the contact wires.

Japanese Laid-Open Patent Publication No. 2001-177056 describes a high potential power supply wire and a low potential power supply wire included in multiple layers of power supply wires. The high potential power supply wire and the low potential power supply wire each include a capacitor power supply wire extending in a planar direction and a thicknesswise direction of a substrate.

Japanese Laid-Open Patent Publication No. 2003-249559 describes multiple layers of power supply wires in which each layer includes a high potential power supply wire and a low potential power supply wire that are parallel and adjacent to each other. The wires of an upper layer traverse the wires of a lower layer. A contact wire connects power supply wires, which are located in the upper layer and the lower layer and have the same potential.

Japanese Laid-Open Patent Publication No. 2004-241762 describes multiple layers of power supply wires in which each layer includes a high potential power supply wire and a low potential power supply wire that are parallel and adjacent to each other. The wires of an upper layer are parallel to the wires of a lower layer.

SUMMARY OF THE INVENTION

In the power supply wire of Japanese Laid-Open Patent Publication No. 2002-324841, the contact wire forming the capacitor is formed only on an end portion of each power supply wire. Thus, the number of contact wires is limited and there are not enough decoupling capacitors.

In the configuration described in Japanese Laid-Open Patent Publication No. 2001-177056, the capacitance between layers is dependent on the distance between the layers. Thus, when the distance between layers increases, sufficient capacitance cannot be obtained. Further, the distance between a capacitor wire, which extends from each power supply wire, and a contact hole, which connects power supply wires having the same potential in the upper and lower layers, increases. Thus, the responsiveness of the capacitor wire to changes in the power supply voltage is poor, and the prevention of power supply voltage fluctuation cannot be ensured.

In the configuration described in Japanese Laid-Open Patent Publication No. 2003-249559, capacitors, which are formed between the power supply wires of the upper and lower layers, are formed only at locations where the power supply wires of the upper and lower layers traverse one another. Thus, there are not enough decoupling capacitors.

In the configuration described in Japanese Laid-Open Patent Publication No. 2004-241762, capacitors are formed only between power supply wires extending parallel to each other in the same layer. Thus, three are not enough decoupling capacitors.

One aspect of the present invention is a semiconductor integrated circuit device provided with a plurality of power supply wire layers including a first potential power supply wire and a second potential power supply wire formed in different layers. At least one capacitor contact wire extends from one of the first and second potential power supply wires toward the other one of the first and second potential power supply wires so as to form a capacitor between each capacitor contact wire and its surrounding wires.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
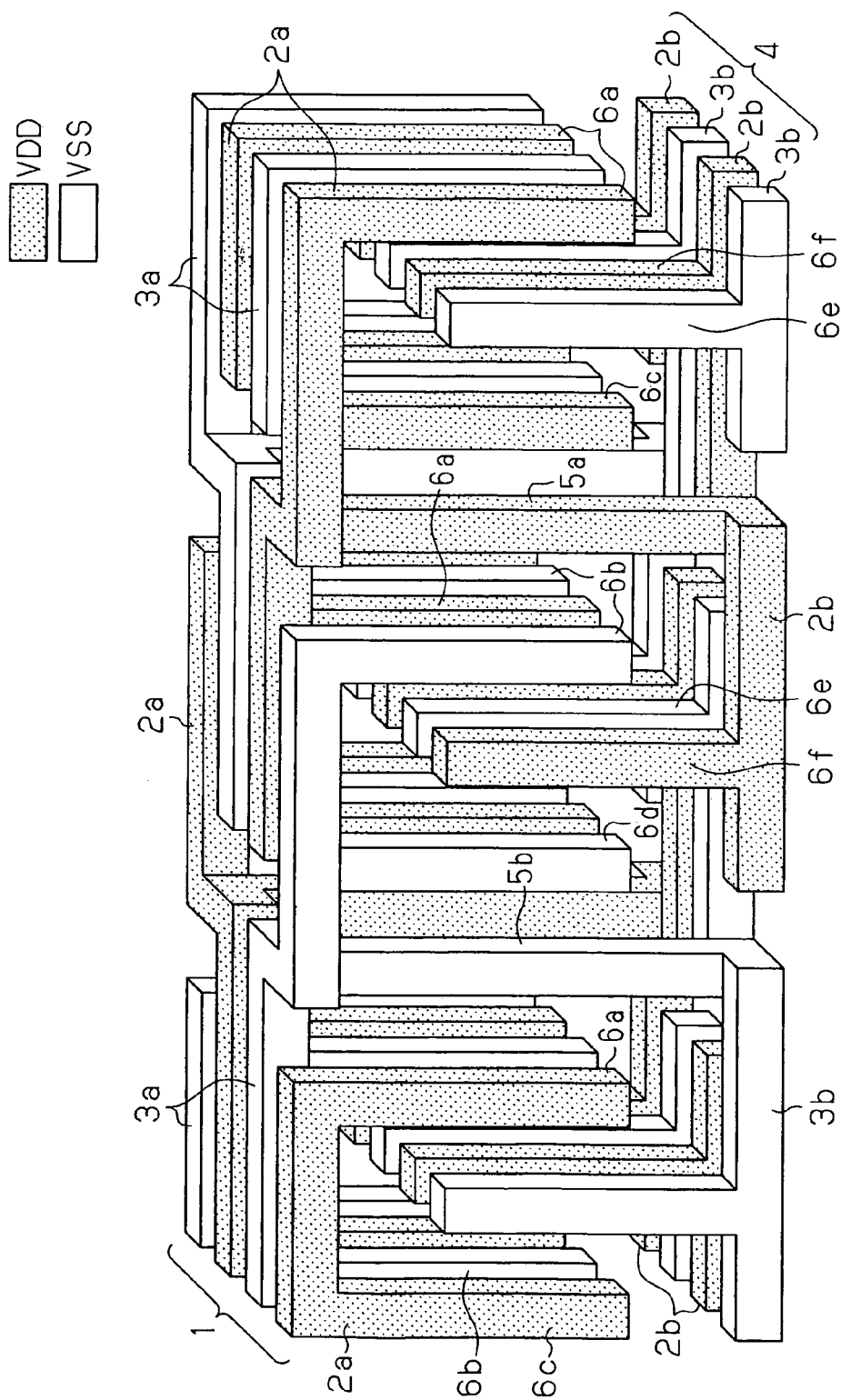
FIGS. 1, 2, and 3 are respectively a perspective view, an exploded perspective view, and a plan view showing a power supply wire layer according to a first embodiment of the present invention.

A semiconductor integrated circuit device according to a first embodiment of the present invention will now be discussed. As shown in FIG. 1, the semiconductor integrated circuit device includes a plurality of power supply wire layers in which decoupling capacitors are formed. The power supply wire layers include a first power supply wire layer 1 and a second power supply wire layer 4.

The first power supply wire layer 1 includes high potential wires (VDD) 2a and low potential wires (VSS) 3a of predetermined lengths. The second power supply wire layer 4 includes high potential wires (VDD) 2b and low potential wires (VSS) 3b of predetermined lengths.

The high potential wires 2a and 2b and the low potential wires 3a and 3b are formed on a substrate and are connected to main power supply wires (not shown) formed on the substrate by, for example, contact wires (not shown).

The shapes of the high potential wires 2a and 2b and the low potential wires 3a and 3b will now be described with reference to FIGS. 2 and 3.

Figure 2:
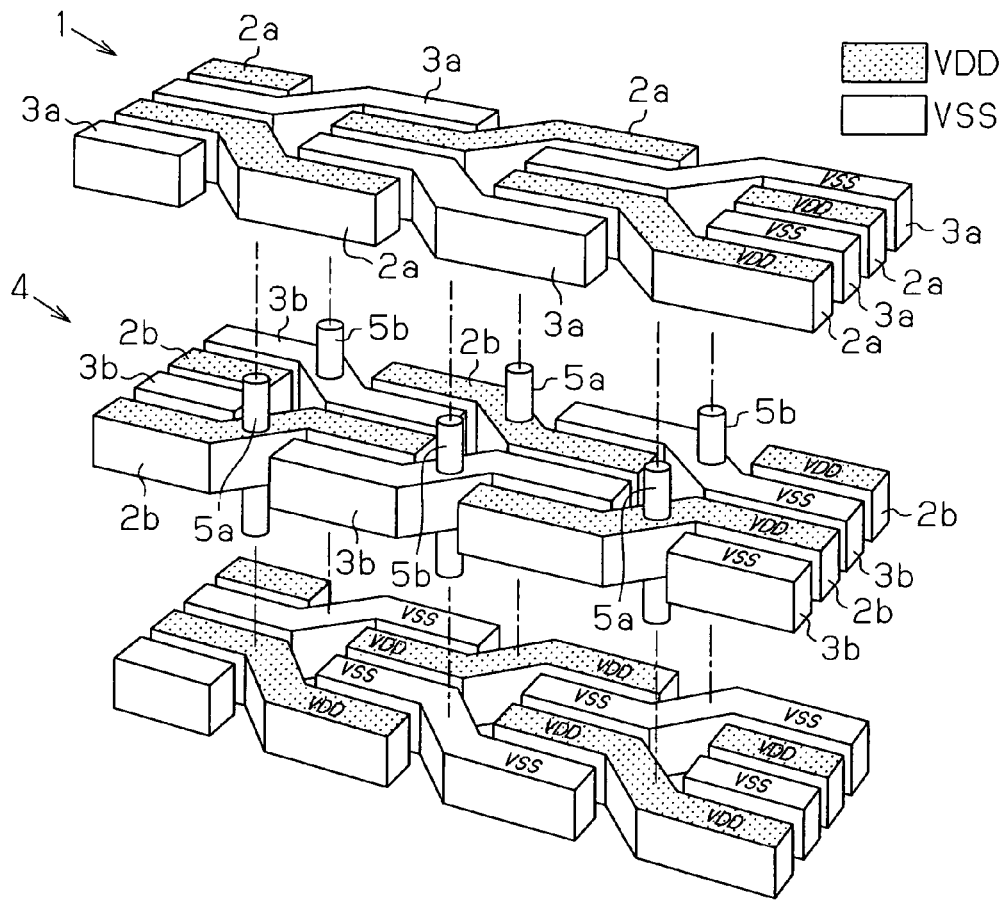
Figure 3:
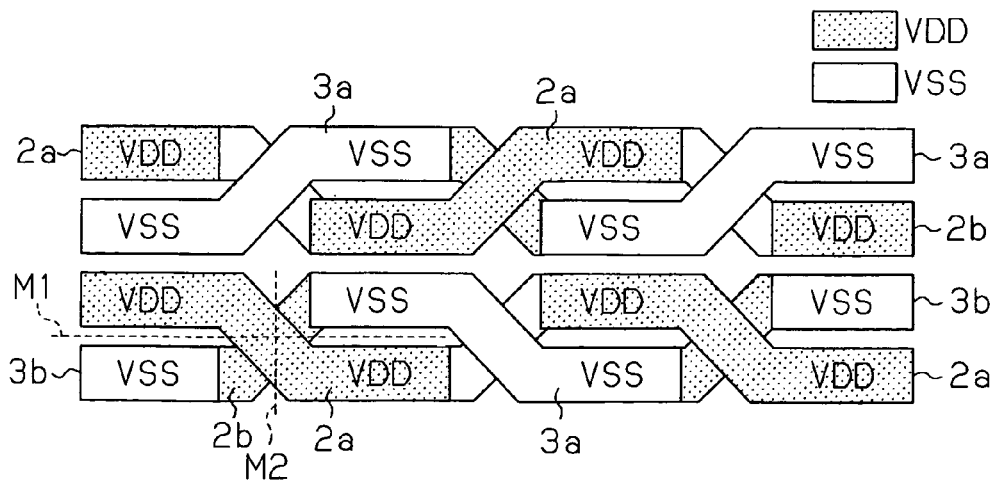

FIG. 2 shows an example of a power supply wire layer having a triple-layer structure. Each of the high potential wires 2a and 2b and the low potential wires 3a and 3b has a bent middle portion so as to extend in a meandering manner.

In the first power supply wire layer 1, the high potential wires 2a and the low potential wires 3a include linear portions that are parallel to one another. In the second power supply wire layer 4, the high potential wires 2b and the low potential wires 3b include linear portions that are parallel to one another. Accordingly, a linear portion of a high potential wire is parallel to a linear portion of a low potential wire to form a capacitor.

The high potential wires 2a of the first power supply wire layer 1 and the high potential wires 2b of the second power supply wire layer 4 meander in an alternating manner with respect to one another. The bent middle portion of each high potential wire 2a in the first power supply wire layer 1 is located above the bent middle portion of a corresponding high potential wire 2b in the second power supply wire layer 4. The linear portions of each high potential wire 2a in the first power supply wire layer 1 is located above the linear portions of corresponding low potential wires 3b in the second power supply wire layer 4. The linear portions of each high potential wire 2a in the first power supply wire layer 1 is not located above the linear portions of corresponding high potential wires 2b in the second power supply wire layer 4. In other words, each high potential wire 2a has a mirror image relationship with the underlying high potential wire 2b. Thus, when each high potential wire 2a is reversed on a plane (M1 or M2 in FIG. 3) lying along an axis (e.g., 5a) that extends through the bent middle portion, the reversal has a shape identical to the high potential wire 2b located below the high potential wire 2a. The first low potential wires 3a of the first power supply wire layer 1 and the low potential wires 3b of the second power supply wire layer 4 have the same relationship as the high potential wires 2a and 2b.

The bent middle portion of each high potential wire 2a in the first power supply wire layer 1 and the bent middle portion of the corresponding high potential wire 2b in the second power supply wire layer 4 are connected to each other by a contact wire 5a. In the same manner, the bent middle portion of each low potential wire 3a in the first power supply wire layer 1 and the bent middle portion of the corresponding low potential wire 3b in the second power supply wire layer 4 are connected to each other by a contact wire 5b. The contact wires 5a connecting the high potential wires 2a and 2b extend parallel to the contact wires 5b connecting the low potential wires 3a and 3b.

The linear portion of each low potential wire 3b in the second power supply wire layer 4 is located below the linear portion of the corresponding high potential wire 2a in the first power supply wire layer 1. The linear portion of each high potential wire 2b in the second power supply wire layer 4 is located below the linear portion of the corresponding low potential wire 3a in the first power supply wire layer 1.

Capacitor contact wires, which do not connect the high potential wires 2a and the low potential wires 3b, and capacitor contact wires, which do not connect the low potential wires 3a and the high potential wires 2b, are arranged between the first power supply wire layer 1 and the second power supply wire layer 4. Each capacitor contact wire (capacitor formation wire) is connected to only a corresponding one of the high and low potential wires.

In the example of FIG. 1, a capacitor contact wire 6a extends downward from one end of each high potential wire 2a in the first power supply wire layer 1. A capacitor contact wire 6b extends downward from an end of each low potential wire 3a in the first power supply wire layer 1. A capacitor contact wire 6c extends downward from a middle position in the linear portion of each high potential wire 2a in the first power supply wire layer 1. A capacitor contact wire 6d extends downward from a middle position in the linear portion of each low potential wire 3a in the first power supply wire layer 1.

A capacitor contact wire 6e extends upward from a middle position in the linear portion of each low potential wire 3b in the second power supply wire layer 4. The capacitor contact wire 6e is located between the corresponding capacitor contact wires 6a and 6c. A capacitor contact wire 6f extends upward from a middle position in the linear portion of each high potential wire 2b in the second power supply wire layer 4. The capacitor contact wire 6f is located between the corresponding capacitor contact wires 6b and 6d.

In this structure, each capacitor contact wire is surrounded by other capacitor contact wires. For example, each capacitor contact wire 6f is surrounded by the capacitor contact wires 6b, 6d, and 6e. Each capacitor contact wire 6e is surrounded by the capacitor contact wires 6a, 6c, and 6f.

Figure 4:
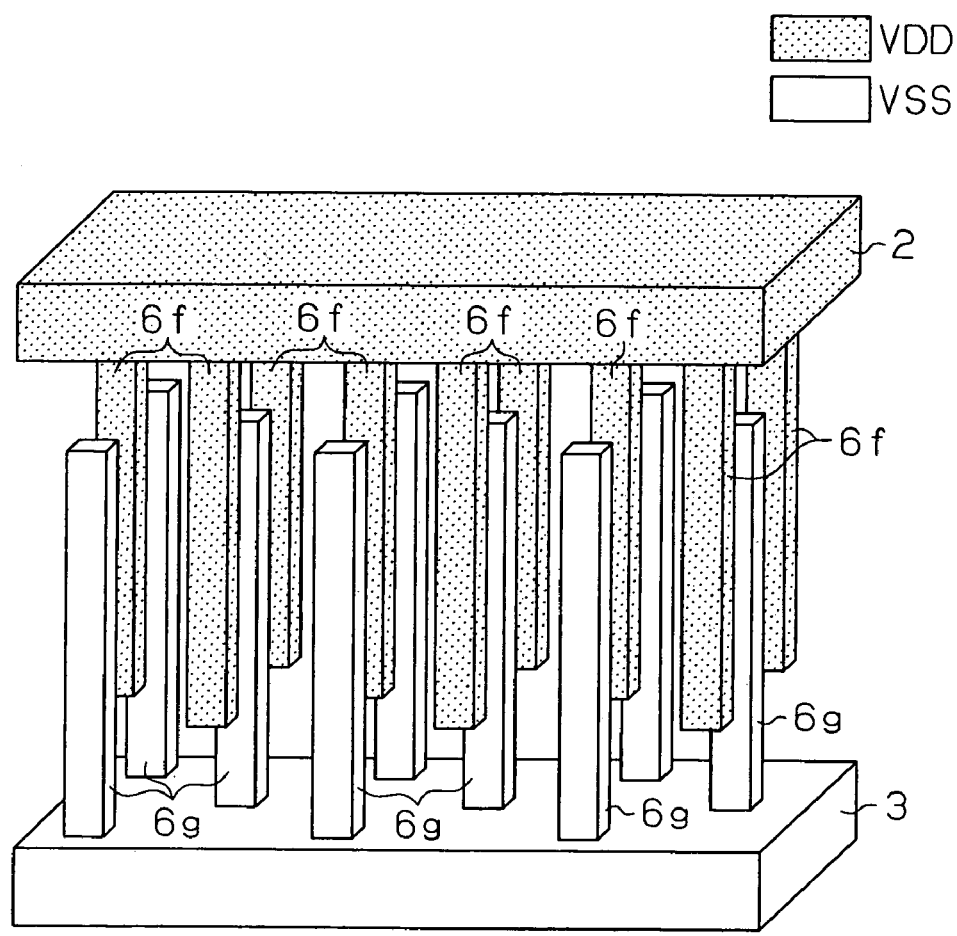
FIG. 4 is a perspective view showing a capacitor contact wire.

The operation of the capacitor contact wire will now be discussed with reference to FIG. 4.

A plurality of capacitor contact wires 6f and a plurality of capacitor contact wires 6g, which respectively extend from the high potential wire 2 and the low potential wire 3, are alternately arranged. In this case, a capacitor is formed between the capacitor contact wires 6f and 6g. Further, a capacitor is formed between the end of each of the capacitor contact wires 6f and 6g and the opposing one of the high potential wire 2 and the low potential wire 3.

The semiconductor integrated circuit device of the first embodiment has the advantages described below.

(1) In each power supply wire layer, decoupling capacitors are formed between parts of the high potential wires 2a and 2b and parts of the low potential wires 3a and 3b. The high potential wires 2a and 2b and the low potential wires 3a and 3b are laid out parallel to one another.

(2) The capacitor contact wires 6a to 6e form a plurality of decoupling capacitors between the high potential wires 2a and low potential wires 3a of the first power supply wire layer 1 and the high potential wires 2b and low potential wires 3b of the second power supply wire layer 4.

(3) A plurality of decoupling capacitors are formed between the capacitor contact wires 6a to 6e.

(4) The capacitor contact wires 6a to 6e are each surrounded by capacitor contact wires having a different power supply voltage, or potential. This easily obtains sufficient capacitance.

(5) The high potential wires 2a and 2b and the low potential wires 3a and 3b each have a bent middle portion. The bent middle portion of each high potential wire 2a locally overlaps the bent middle portion of the underlying high potential wire 2b. Accordingly, the middle portion of each high potential wire 2a in the first power supply wire layer 1 and the middle portion of the corresponding high potential wire 2b in the second power supply wire layer 4 are connected by the contact wire 5a linearly by the shortest distance. Further, the bent middle portion of each low potential wire 3a locally overlaps the bent middle portion of the underlying low potential wire 3b. Accordingly, the middle portion of each low potential wire 3a in the first power supply wire layer 1 and the middle portion of the corresponding low potential wire 3b in the second power supply wire layer 4 are connected by the contact wire 5b linearly by the shortest distance.

(6) The contact wires 5a connect the bent middle portions of the high potential wires 2a in the first power supply wire layer 1 to the bent middle portions of the corresponding high potential wires 2b in the second power supply wire layer 4. The contact wires 5b connect the bent middle portions of the low potential wires 3a in the first power supply wire layer 1 to the bent middle portions of the corresponding low potential wires 3b in the second power supply wire layer 4. This reduces the distance from the contact wires 5a and 5b to the portions where the decoupling capacitors act. Thus, the responsiveness of the decoupling capacitors is improved, and the power supply noise is effectively absorbed.

(7) The above structure forms decoupling capacitors having sufficient capacitance in a semiconductor integrated circuit.

Figure 5:
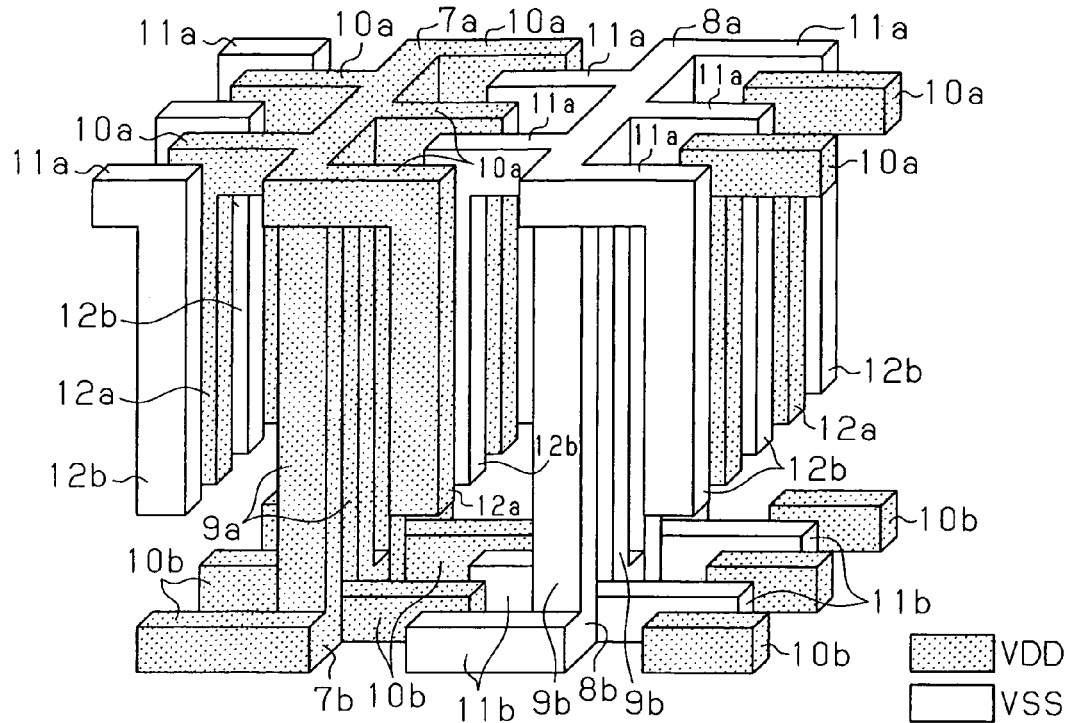
FIGS. 5 and 6 are respectively a perspective view and a plan view showing a power supply wire layer according to a second embodiment of the present invention.
Figure 6:
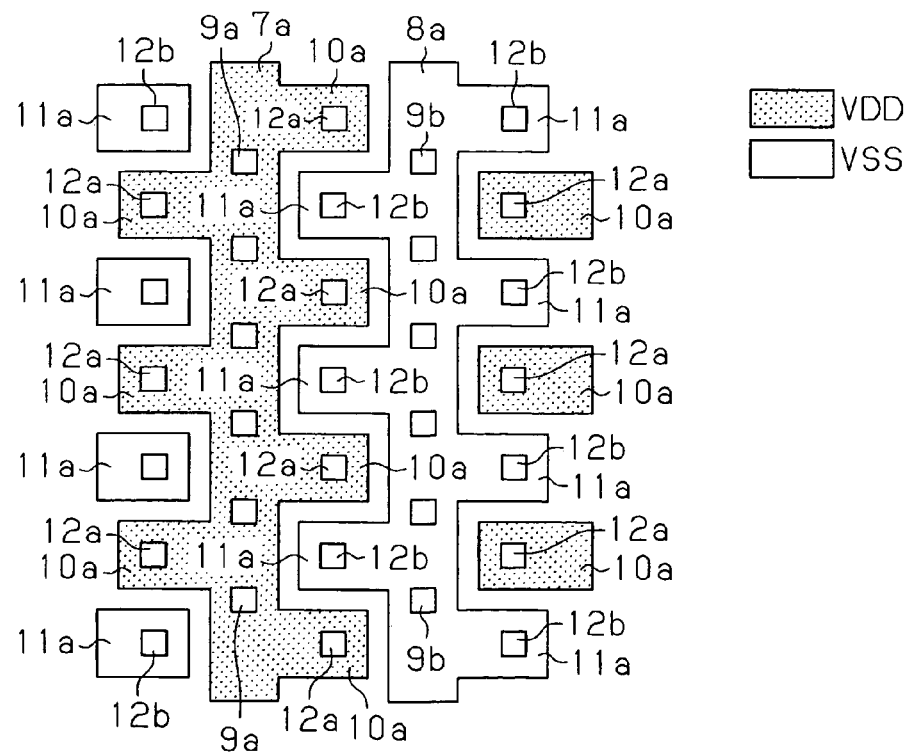

A second embodiment will now be described with reference to FIGS. 5 and 6.

A semiconductor integrated circuit device of the second embodiment includes a first power supply wire layer 1 having a linear high potential wire 7a and a low potential wire 8a. A second power supply wire layer 4 includes a high potential wire 7b and a low potential wire 8b.

The high potential wire 7b is located below the high potential wire 7a. The low potential wire 8b is located below the low potential wire 8a. A plurality of contact wires 9a connect the high potential wires 7a and 7b at predetermined intervals. A plurality of contact wires 9b connect the low potential wires 8a and 8b at predetermined intervals.

Branch wires 10a extend from the high potential wire 7a toward the low potential wire 8a. Branch wires 11a extend from the low potential wire 8a toward the high potential wire 7a. The branch wires 10a and 11a are alternately arranged. Further, capacitors are formed between the branch wires 10a and 11a.

Branch wires 10b extend from the high potential wire 7b toward the low potential wire 8b. Branch wires 11b extend from the low potential wire 8b toward the high potential wire 7b. The branch wires 10b and 11b are alternately arranged. Further, capacitors are formed between the branch wires 10b and 11b.

The branch wires 11b extending from the low potential wire 8b are located below the branch wires 10a of the first power supply wire layer 1. The branch wires 10b extending from the high potential wire 7b are located below the branch wires 11a of the first power supply wire layer 1.

Capacitor contact wires 12a extend downward from distal ends of the branch wires 10a. Capacitor contact wires 12b extend downward from distal ends of the branch wires 11a. The capacitor contact wires 12a and 12b are alternately arranged. A capacitor is formed between adjacent ones of the capacitor contact wires 12a and 12b.

The capacitor contact wires 12a have distal ends spaced from the underlying branch wires 11b by a predetermined distance. The capacitor contact wires 12b have distal ends spaced from the underlying branch wires 10b by a predetermined distance. A capacitor is formed between the distal ends of the capacitor contact wires 12a and 12b and the underlying branch wires 11b and 10b.

The semiconductor integrated circuit device of the second embodiment has the advantages described below.

(1) Capacitors are formed between the branch wires 10a and 11a of the first power supply wire layer 1. Further, capacitors are formed between the branch wires 10b and 11b of the second power supply wire layer 4.

(2) A capacitor is formed between adjacent ones of the capacitor contact wires 12a and 12b.

(3) Capacitors are formed between the distal ends of the capacitor contact wires 12a and 12b and the opposing branch wires 11b and 10b.

(4) The distance from the contact wires 9a, which connect the high potential wires 7a and 7b, and the contact wires 9b, which connect the low potential wires 8a and 8b, to the portions where the capacitors are formed may be reduced. This improves the responsiveness of the decoupling capacitors and effectively absorbs the power supply noise.

(5) The above structure forms decoupling capacitors having sufficient capacitance.

Figure 7:
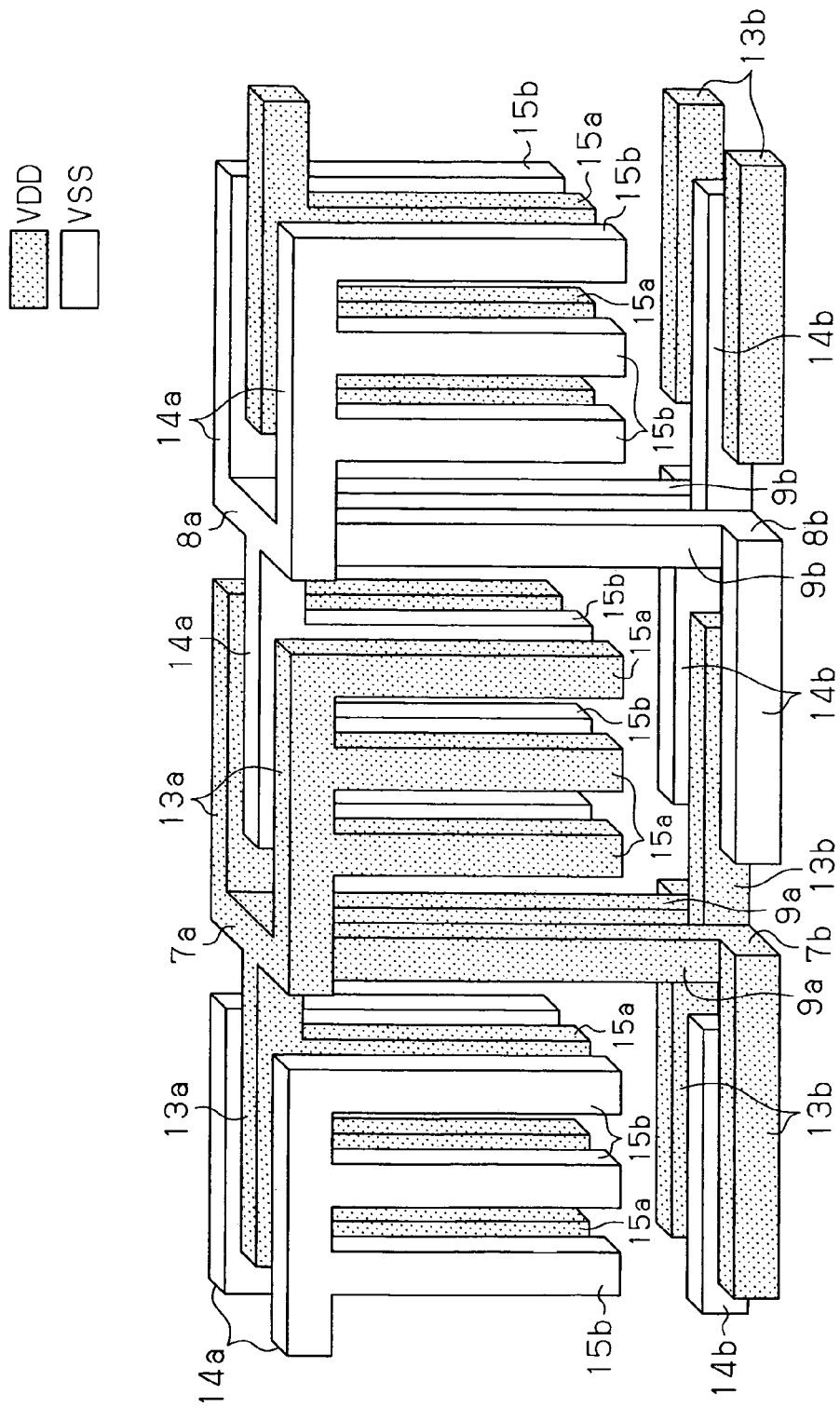
FIGS. 7 and 8 are respectively a perspective view and a plan view showing a power supply wire layer according to a third embodiment of the present invention.
Figure 8:
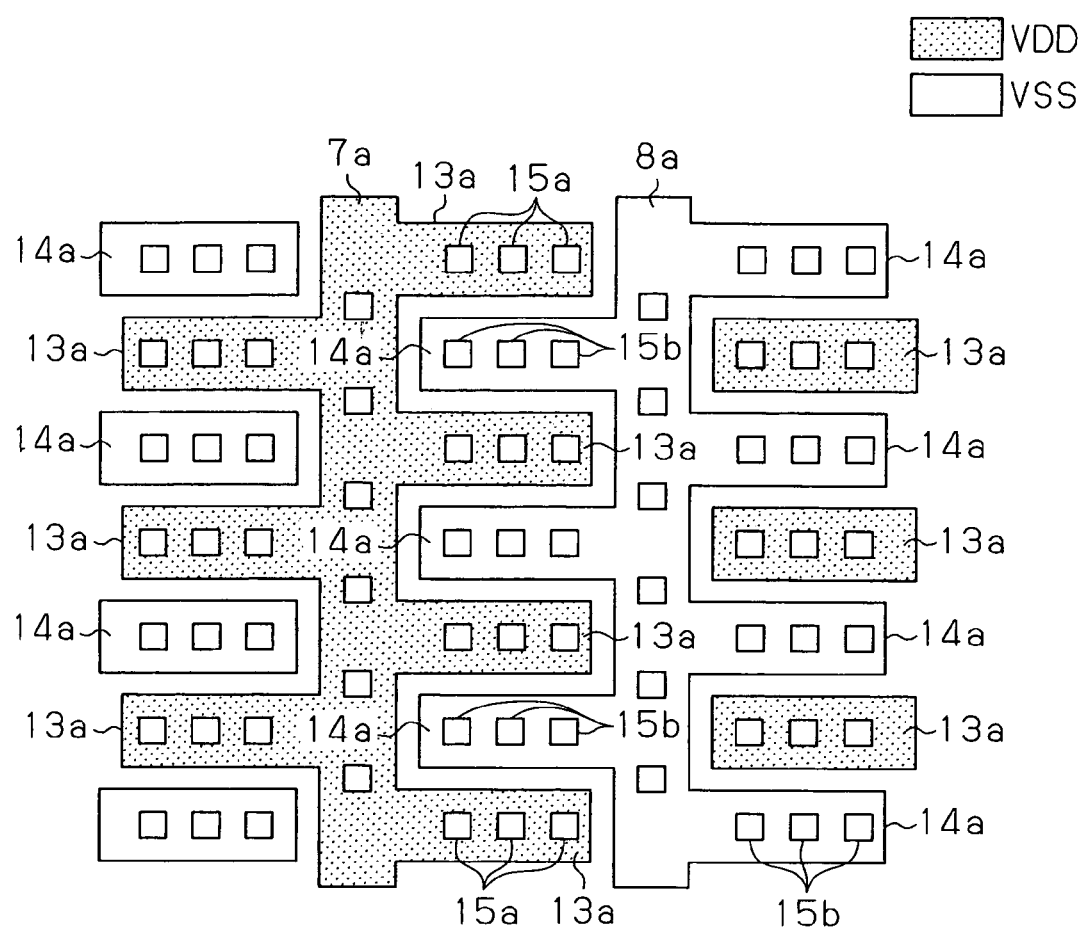

A third embodiment will now be discussed with reference to FIGS. 7 and 8.

A semiconductor integrated circuit device of the third embodiment includes a plurality of relatively long branch wires and a plurality of capacitor contact wires respectively formed on the branch wires. For the sake of brevity, like or same reference numerals are given to those components that are the same as the corresponding components of the second embodiment.

Branch wires 13a, 13b, 14a, and 14b are longer than the branch wires 10a, 10b, 11a, and 11b of the second embodiment. Three capacitor contact wires 15a are formed on each branch wire 13a, and three capacitor contact wires 15b are formed on each branch wire 14a.

In the semiconductor integrated circuit device of the third embodiment, the capacitor contact wires 15a and 15b are increased in number. This further increases the decoupling capacitors in comparison with the second embodiment.

Figure 9:
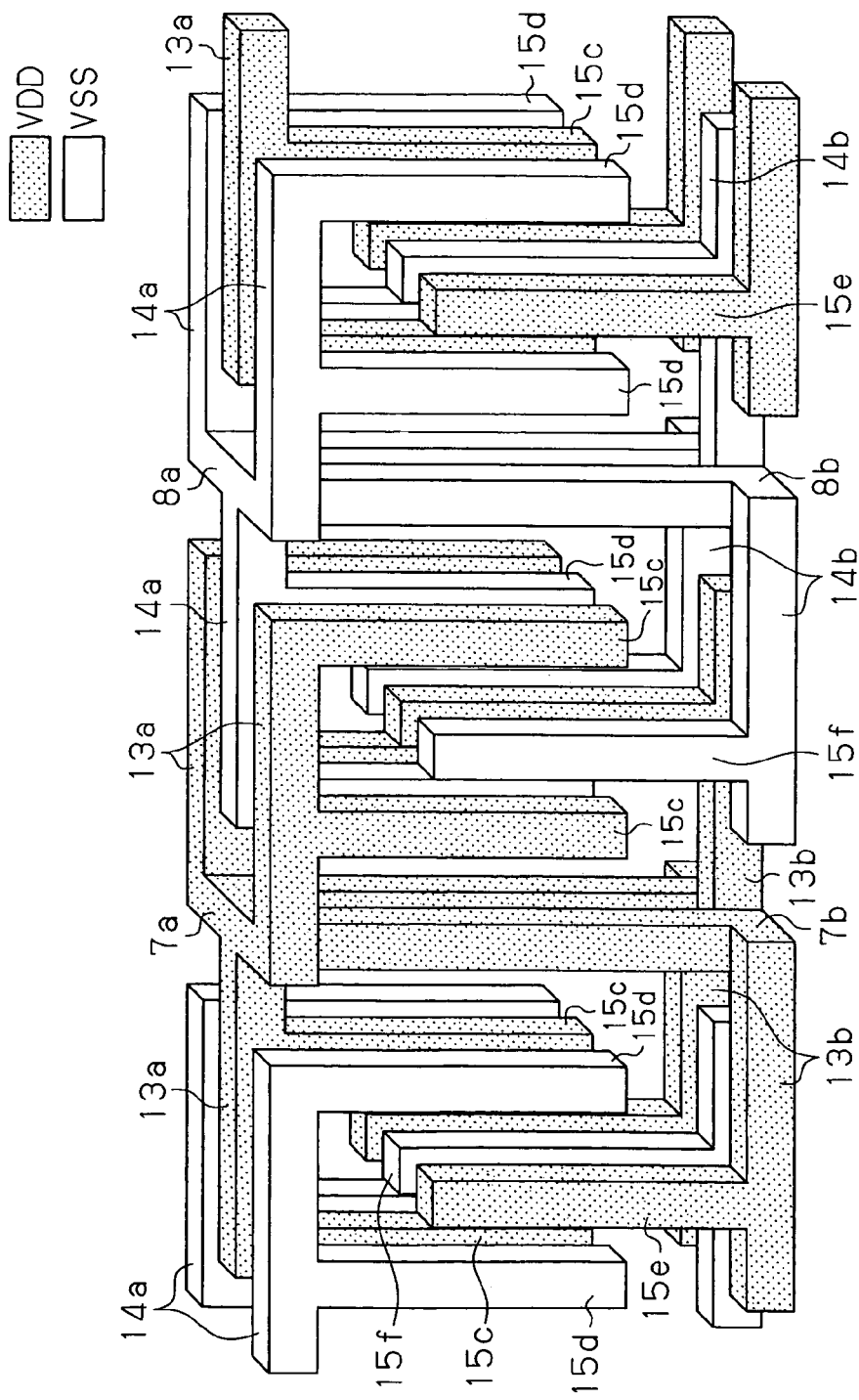
FIGS. 9, 10, and 11 are respectively a perspective view showing a power supply wire layer according to a fourth embodiment of the present invention, a plan view showing a first power supply wire layer, and a plan view showing a second power supply wire layer.
Figure 10:
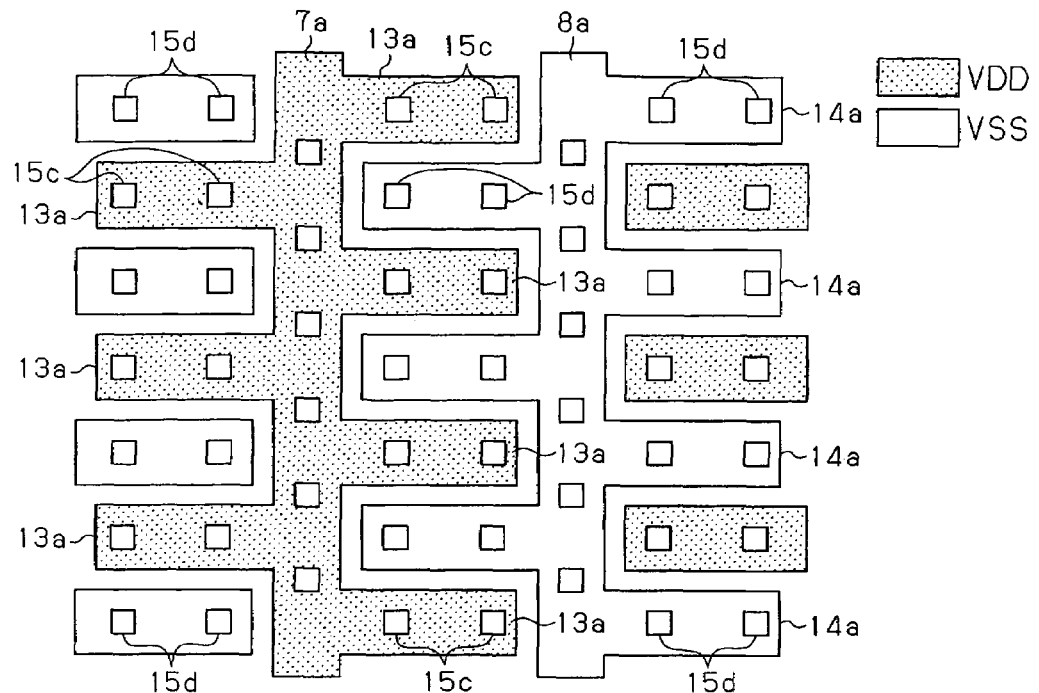
Figure 11:
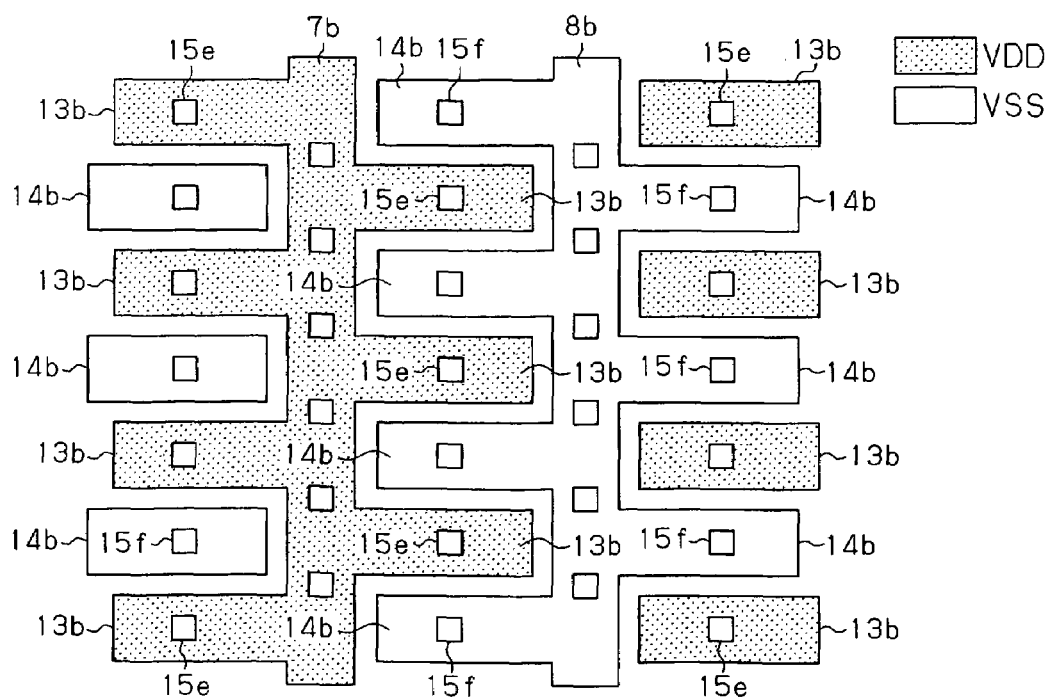

A fourth embodiment will now be discussed with reference to FIGS. 9 to 11.

In the third embodiment, three capacitor contact wires 15a are formed on each branch wire 13a, and three capacitor contact wires 15b are formed on each branch wire 14a. In the fourth embodiment, capacitor contact wires extend from each of the branch wires 13a, 13b, 14a, and 14b of the first power supply wire layer 1 and the second power supply wire layer 4. For the sake of brevity, like or same reference numerals are given to those components that are the same as the corresponding components of the third embodiment.

In the first power supply wire layer 1, two capacitor contact wires 15c extend downward from each branch wire 13a, and two capacitor contact wires 15d extend downward from each branch wire 14a. In the second power supply wire layer 4, one capacitor contact wire 15e extends upward from each branch wire 13b, and one capacitor contact wire 15f extends upward from each branch wire 14b. Each of the capacitor contact wires 15e and 15f is arranged between the corresponding capacitor contact wires 15c and 15d.

In the semiconductor integrated circuit device of the fourth embodiment, capacitors are formed between the capacitor contact wires 15c, 15f, 15d, and 15e. Thus, decoupling capacitors are further increased in number compared with the third embodiment.

A fifth embodiment will now be discussed with reference to FIGS. 12 and 13.

In comparison with the fourth embodiment, the capacitor contact wires formed on each branch wire is increased in number in the fifth embodiment. For the sake of brevity, like or same reference numerals are given to those components that are the same as the corresponding components of the fourth embodiment.

Figure 12:
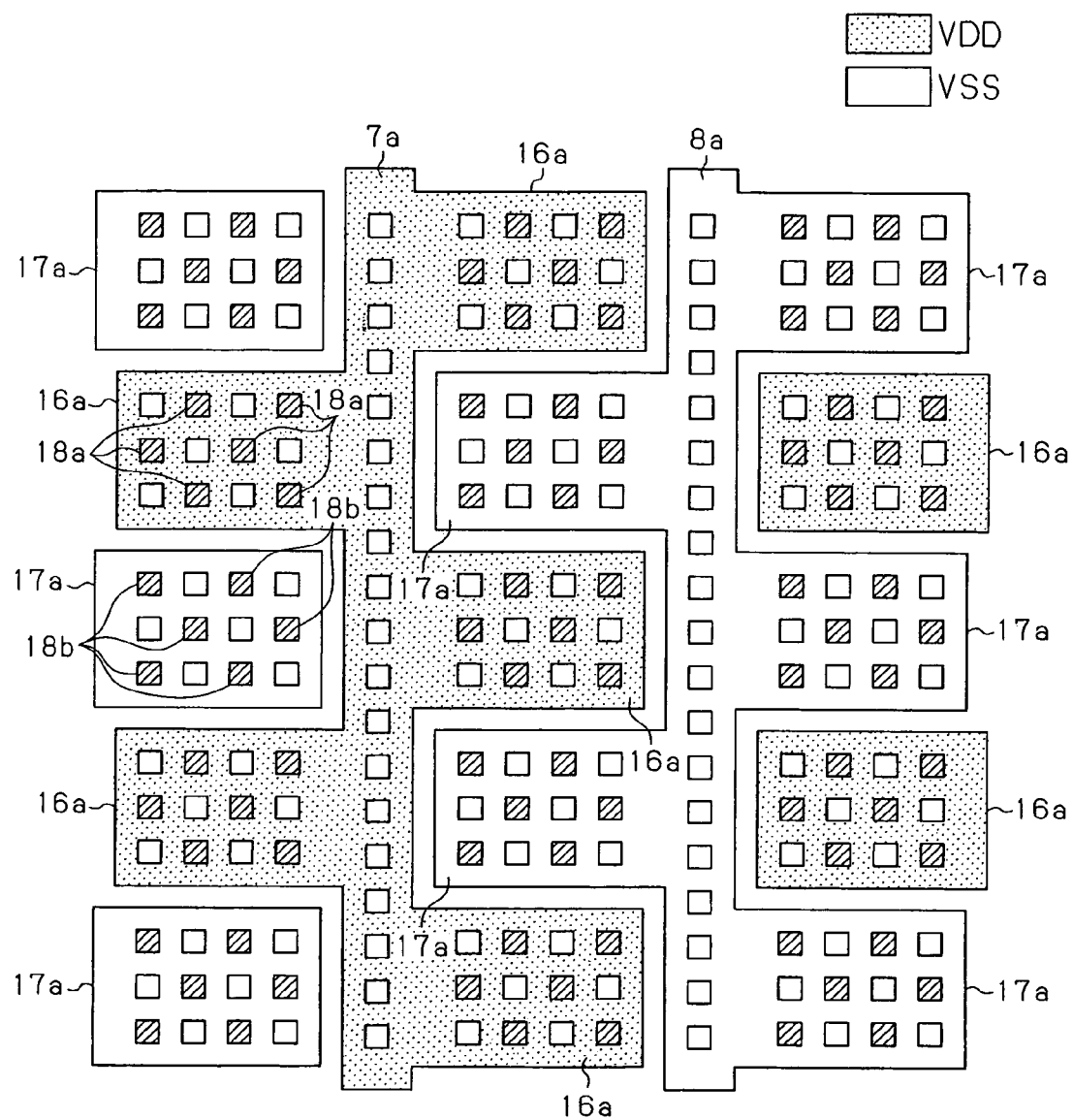
FIGS. 12 and 13 are respectively a plan view showing a first power supply wire according to a fifth embodiment of the present invention and a plan view showing a second power supply wire layer.
Figure 13:
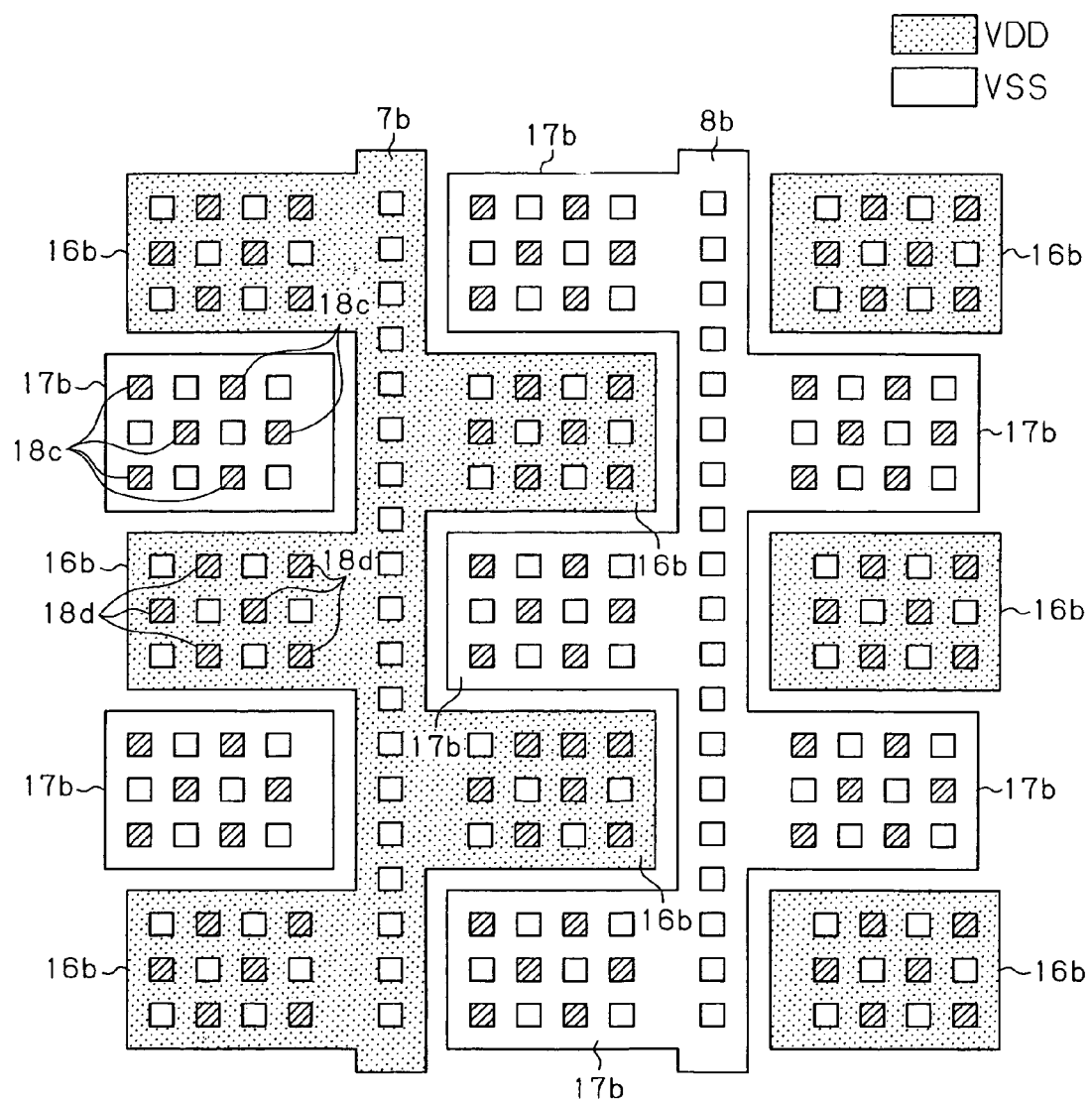

As shown in FIG. 12, a high potential wire 7a and a low potential wire 8a of the first power supply wire layer 1 are linear. The wires 7a and 8a respectively include a plurality of branch wires 16a and 17a. As shown in FIG. 13, a high potential wire 7b and a low potential wire 8b of the second power supply wire layer 4 are linear. The wires 7b and 8b respectively include a plurality of branch wires 16b and 17b. The area of the branch wires 16a, 16b, 17a, and 17b is greater than that of the branch wires 13a, 13b, 14a, and 14b of the fourth embodiment.

In the first power supply wire layer 1, the branch wires 16a each include, for example, six capacitor contact wires 18a extending downward, and the branch wires 17a each include, for example, six capacitor contact wires 18b extending downward. The branch wires 17b and 16b of the second power supply wire layer 4 respectively oppose the branch wires 16a and 17a. The branch wires 17b each include, for example, six capacitor contact wires 18c extending upward, and the branch wires 16b each include, for example, six capacitor contact wires 18d extending upward. The capacitor contact wires 18a and 18b and the capacitor contact wires 18c and 18d are alternately arranged (refer to FIG. 4).

In the semiconductor integrated circuit device of the fifth embodiment, a capacitor is formed between the capacitor contact wires 18a to 18b of which the number is greater than that in the fourth embodiment. Thus, decoupling capacitors are increased in number compared with the fourth embodiment.

Figure 15:
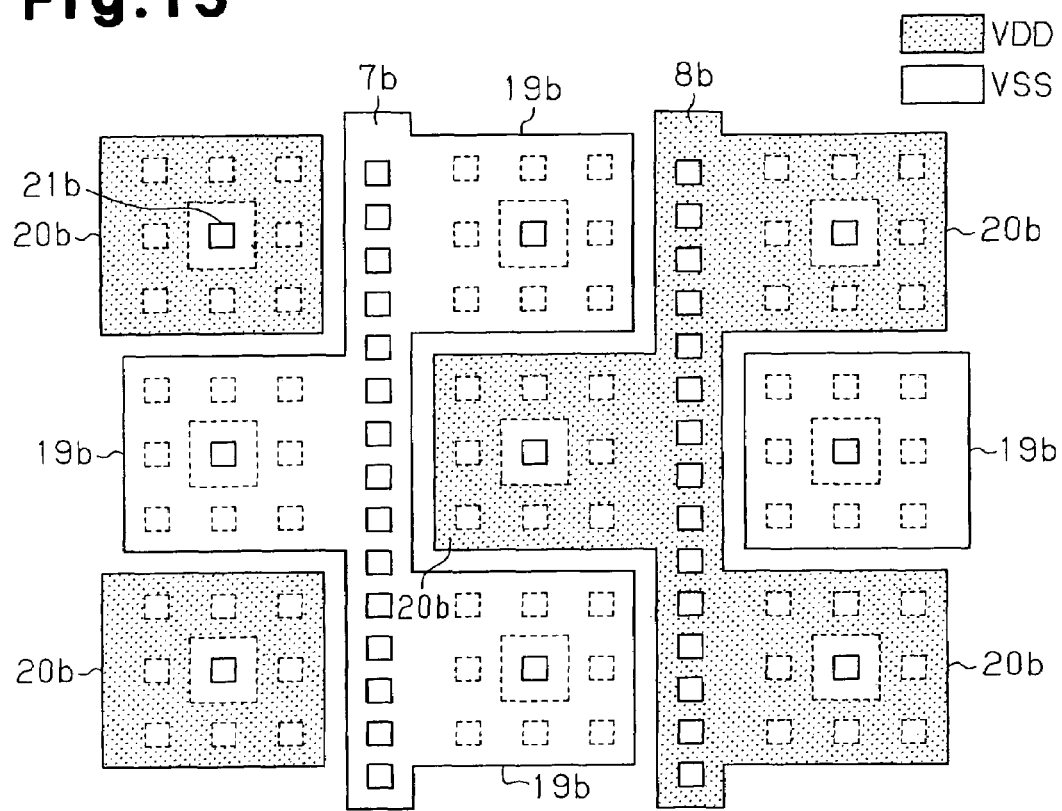
Figure 16:
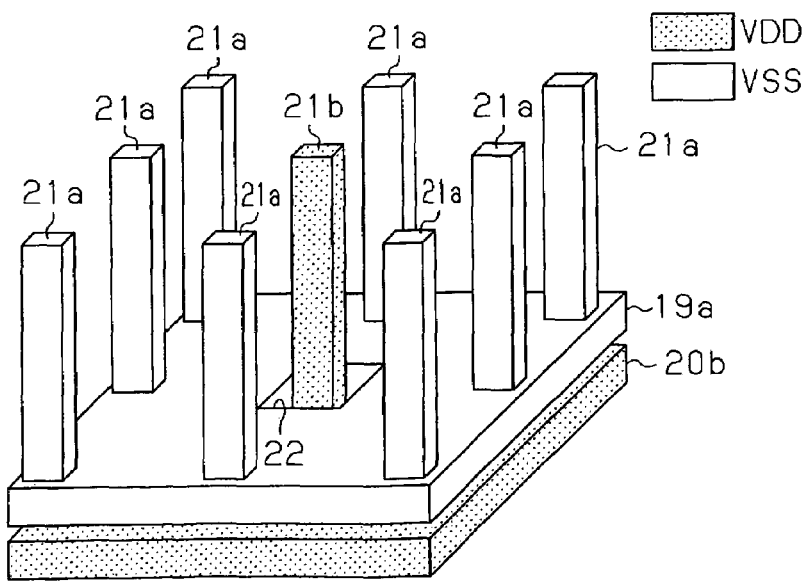

A sixth embodiment will now be discussed with reference to FIGS. 14 to 16.

In the second to fifth embodiments, the formation of the capacitor contact wires become difficult when the distance of the high potential and low potential wires in the first power supply wire layer 1 from the high potential and low potential wires in the second power supply wire layer 4 becomes short. In the sixth embodiment, the formation of decoupling capacitors with capacitor contact wires is ensured even if the distance between the first power supply wire layer 1 and the second power supply wire layer 4 is short. For the sake of brevity, like or same reference numerals are given to those components that are the same as the corresponding components of the fifth embodiment.

Figure 14:
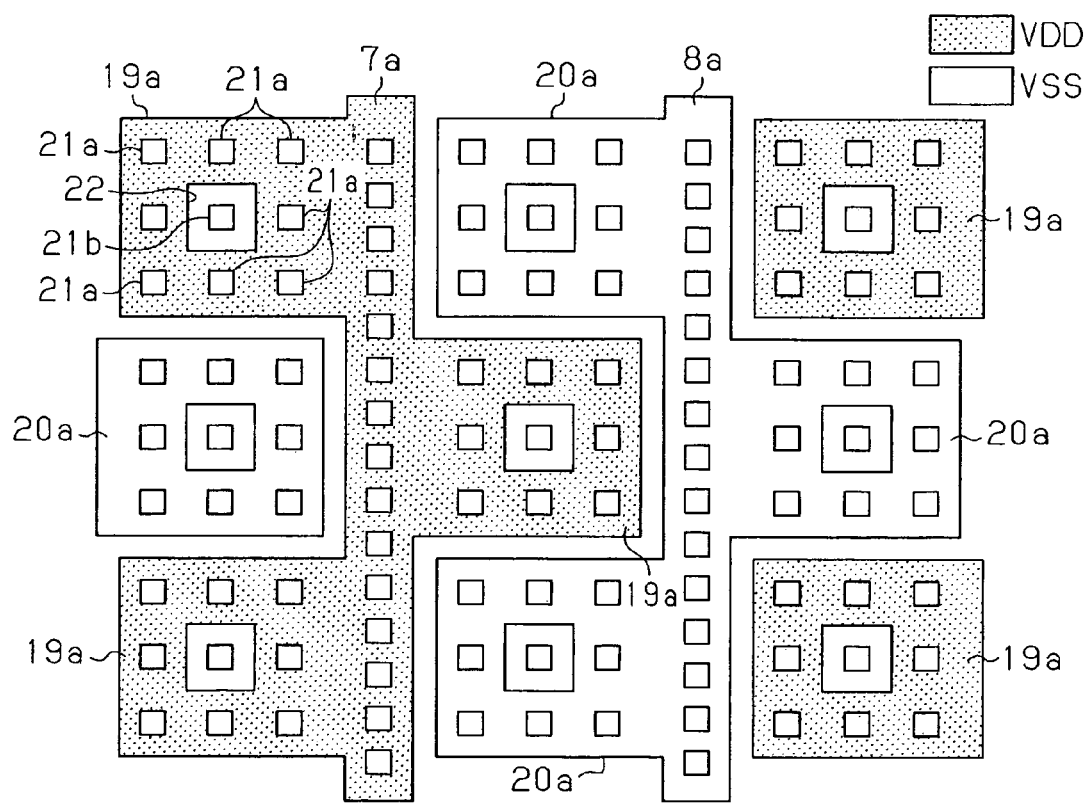
FIGS. 14, 15, and 16 are respectively a plan view of a first power supply wire layer, a plan view of a second power supply wire layer, and a perspective view of a power supply wire layer.

As shown in FIG. 14, a plurality of branch wires 19a are formed on the high potential wire 7a of the first power supply wire layer 1. A plurality of branch wires 20a are formed on the low potential wire 8a in the first power supply wire layer 1. As shown in FIG. 15, a plurality of branch wires 19b are formed on the high potential wire 7b of the second power supply wire layer 4. A plurality of branch wires 20b are formed on the low potential wire 8b in the second power supply wire layer 4.

The branch wires 19a and the underlying branch wires 20b will now be discussed with reference to FIG. 16. For example, eight capacitor contact wires 21a extend upward from the edges of each branch wire 19a. A hole 22 is formed in the center of each branch wire 19a.

A capacitor contact wire 21b extends upward from the center of each branch wire 20b. The corresponding hole 22 receives the capacitor contact wire 21b. The branch wires 20a of the first power supply wire layer 1 and the branch wires 19b of the second power supply wire layer 4 are formed in a manner similar to the branch wires 19a and 20b.

In the semiconductor integrated circuit device of the sixth embodiment, a capacitor is formed between the capacitor contact wire 21b and the surrounding capacitor contact wires 21a. Accordingly, even if the distance between the first power supply wire layer 1 and the second power supply wire layer 4 is short, capacitor contact wires may be formed on branch wires.

Figure 17:
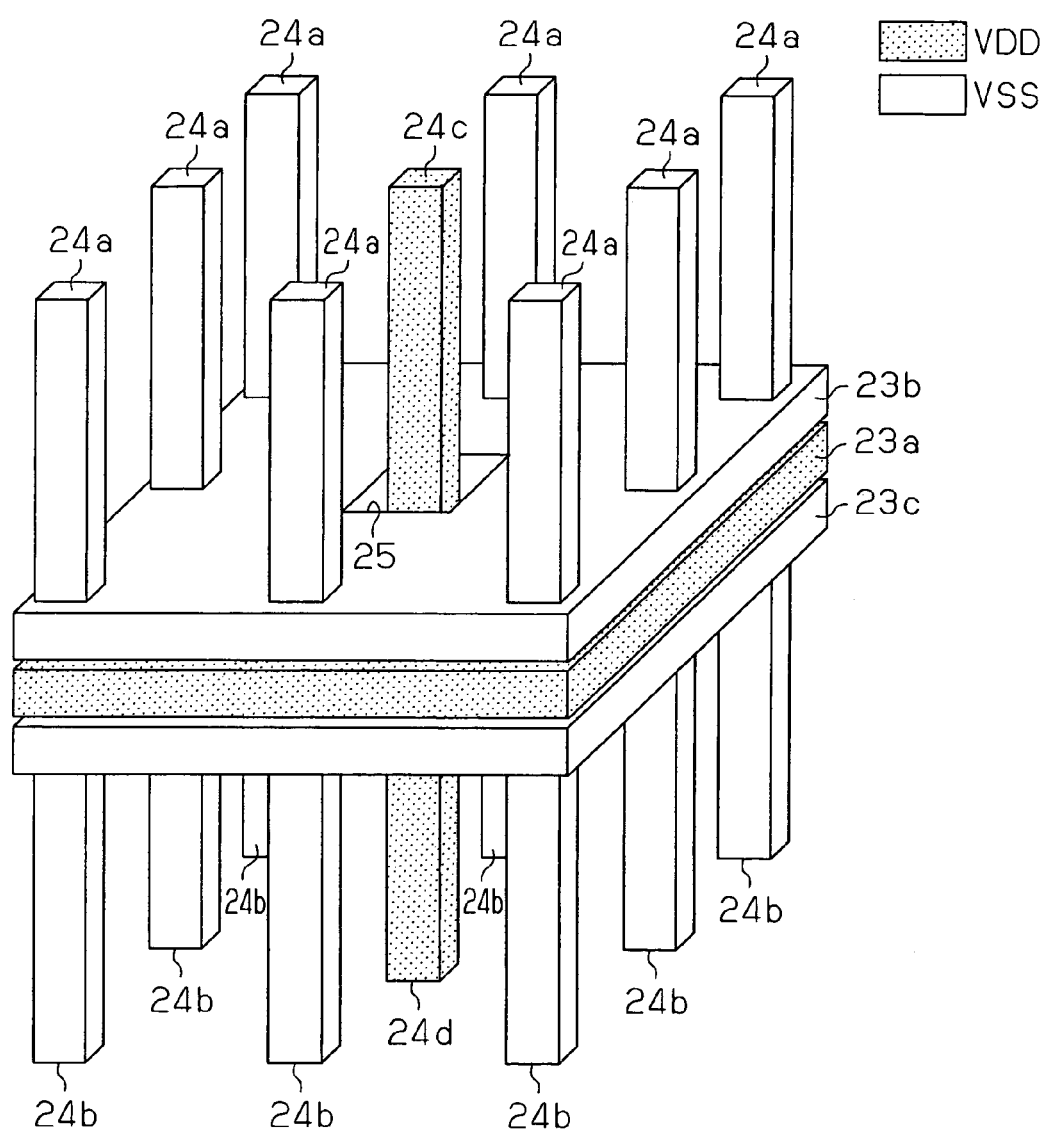
FIG. 17 is a perspective view showing a power supply wire layer according to a seventh embodiment of the present invention.

A seventh embodiment will now be discussed with reference to FIG. 17.

In the seventh embodiment, a branch wire 23a, which has a first potential, is located in a narrow space between branch wires 23b and 23c, which have a second potential. A plurality of capacitor contact wires 24a extend upward from the edges of the branch wire 23b. A plurality of capacitor contact wires 24b extend downward from the edges of the branch wire 23c.

A hole 25 extends through the center of each of the branch wires 23b and 23c. Capacitor contact wire 24c and 24d respectively extend upward and downward from the upper and lower surfaces in the center of the branch wire 23a. The holes of the branch wires 23b and 23c respectively receive the capacitor contact wires 24c and 24d.

In the semiconductor integrated circuit device of the seventh embodiment, a capacitor is formed between the capacitor contact wires 24c and the surrounding capacitor contact wires 24a. Further, a capacitor is formed between the capacitor contact wire 24d and the surrounding capacitor contact wires 24b. Accordingly, capacitor contact wires are formed on the branch wires even in a triple-layer structure in which the space between the high potential and low potential power supply wires is narrow.

An eighth embodiment will now be discussed with reference to FIGS. 18 and 19.

Figure 18:
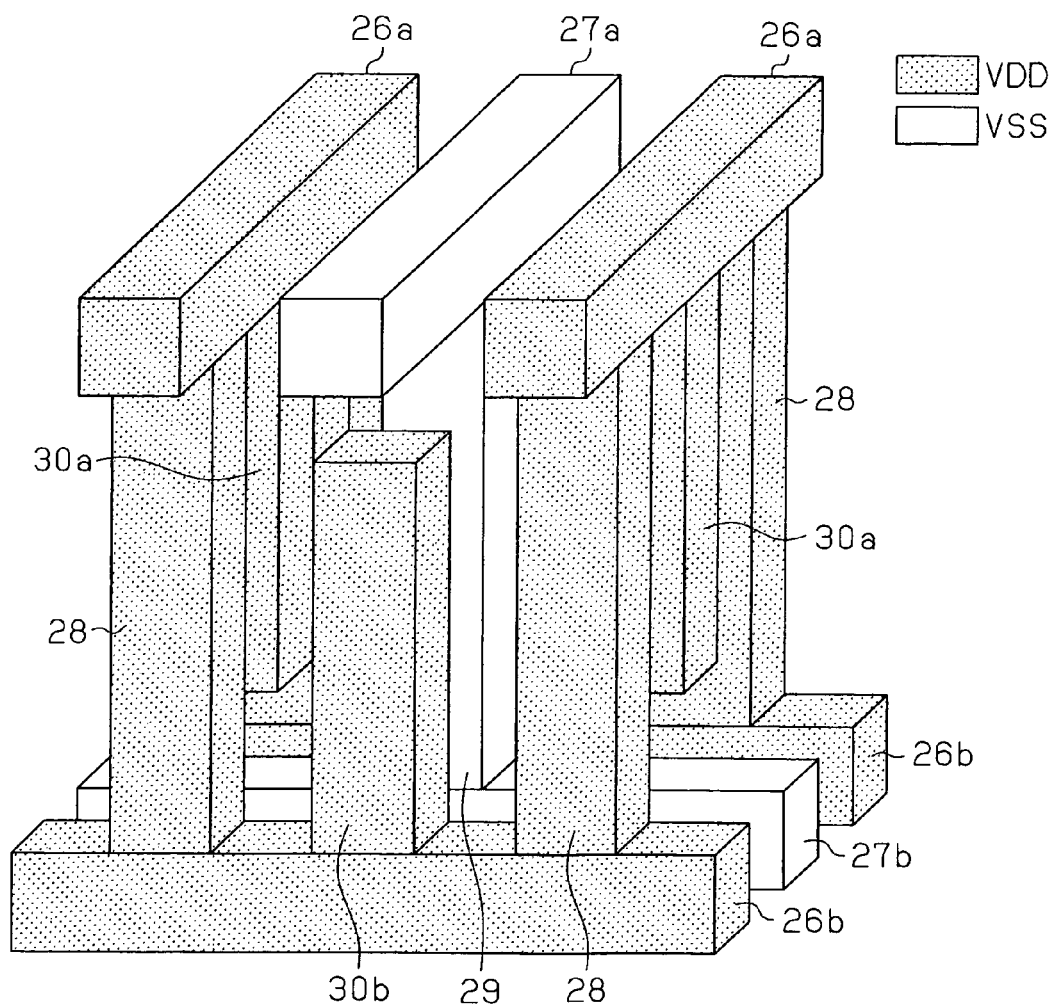
FIGS. 18 and 19 are respectively a perspective view and a plan view of a power supply wire layer according to an eighth embodiment of the present invention.

Referring to FIG. 18, high potential wires 26a and low potential wires 27a are located in a first power supply wire layer, and high potential wires 26b and low potential wires 27b are located in a second power supply wire layer. The high potential wires 26a and the low potential wires 27a extend in a first direction, and the high potential wires 26b and the low potential wires 27b extend in a second direction, which is orthogonal to the first direction.

Figure 19:
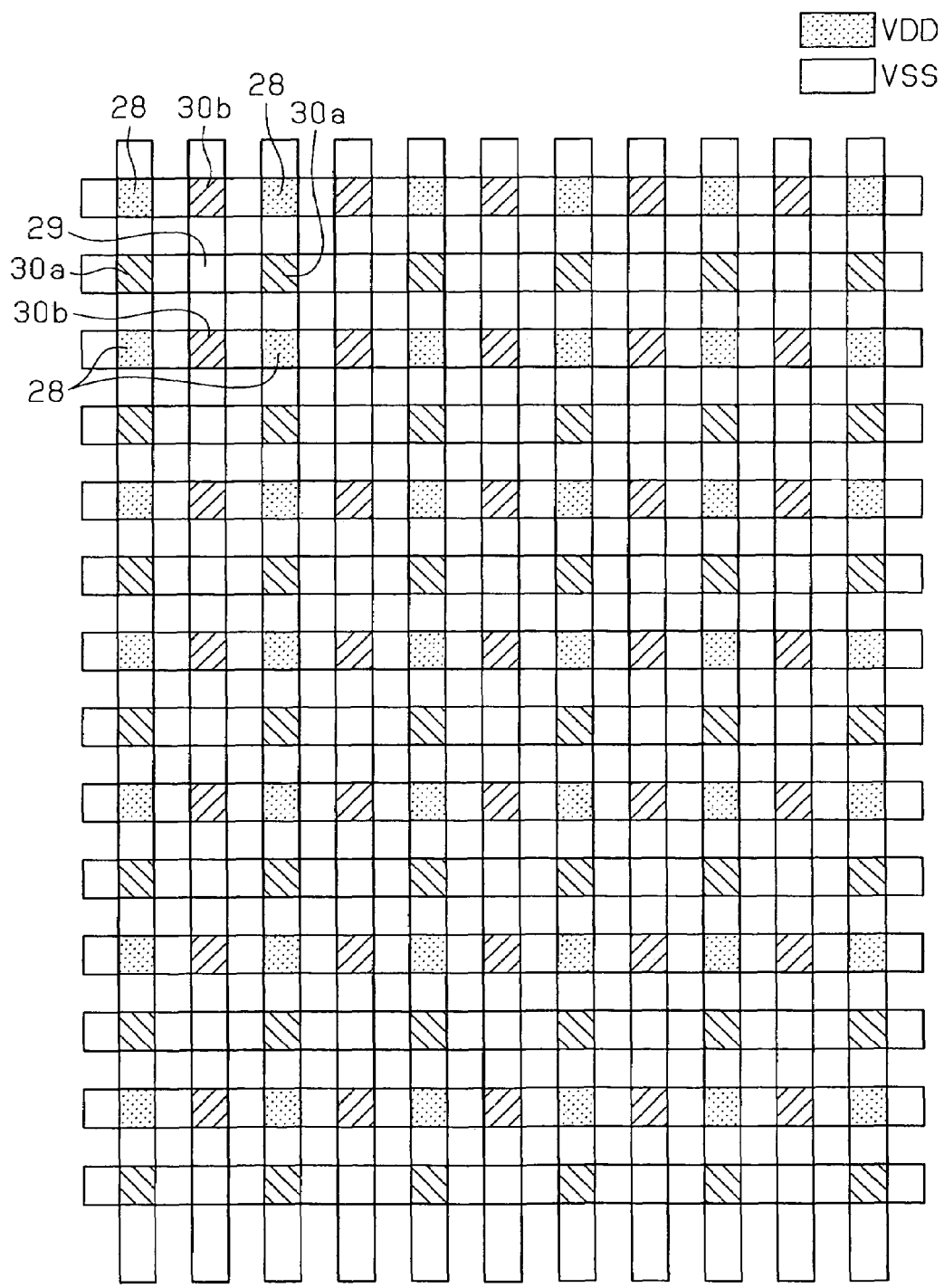

Referring to FIG. 19, the high potential wires 26a are connected to a plurality of contact wires 28 at a plurality of first grid points, or intersecting points with the high potential wires 26b when viewed from above. The low potential wires 27a are connected to a plurality of contact wires 29 at a plurality of first grid points, or intersecting points with the low potential wires 27b when viewed from above.

A plurality of capacitor contact wires 30a are respectively formed at a plurality of second grid points, or intersecting points between the high potential wires 26a and the low potential wires 27b. The capacitor contact wires 30a extend from the high potential wires 26a toward the low potential wires 27b. A plurality of capacitance contact wires 30b are respectively formed at a plurality of second grid points, or intersecting points between the high potential wires 26b and the low potential wires 27a. The capacitor contact wires 30b extend from the high potential wires 26b toward the low potential wires 27a.

In the semiconductor integrated circuit device of the eighth embodiment, a capacitor is formed between the capacitor contact wires 30a and the adjacent contact wires 29 and low potential wires 27b. Further, a capacitor is formed between the capacitor contact wires 30b and the adjacent contact wires 29 and low potential wires 27a.

Accordingly, the capacitor contact wires 30a and 30b may be formed in large numbers to increase the decoupling capacitor even when the high potential wires 26b and the low potential wires 27b in the first power supply wire layer 1 intersect with the high potential wires 26b and the low potential wires 27b in the second power supply wire layer 4.

In each of the above embodiments, the power supply wire layers may be further increased in number.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor integrated circuit device comprising:
   a plurality of power supply wire layers including a first potential power supply wire and a second potential power supply wire formed in different layers; and
   at least one capacitor contact wire extending from one of the first and second potential power supply wires toward the other one of the first and second potential power supply wires and forming a capacitor between each capacitor contact wire and its surrounding capacitor contact wires, wherein:
   the power supply wire layers each include a plurality of meandered first potential power supply wires, each having a bent middle portion, and a plurality of meandered second potential power supply wires, each having a bent middle portion, with the plurality of meandered first potential power supply wires and the plurality of meandered second potential power supply wires arranged alternately in each of the power supply wire layers;
   the plurality of power supply wire layers include a first layer and an adjacent second layer;
   the bent middle portions of the first and second potential power supply wires in the first layer and the bent middle portions of power supply wires having the same potential in the second layer are opposed to each other and connected to each other by a plurality of contact wires;
   the first potential power supply wires and the second potential power supply wires have portions exclusive of the bent middle portions that are respectively opposed to power supply wires having different potentials in the second layer; and
   the at least one capacitor contact wire includes a plurality of capacitor contact wires extending from each of the first and second potential power supply wires in the first layer toward the power supply wires having different potentials in the second layer.

2. The semiconductor integrated circuit device according to claim 1, wherein the at least one capacitor contact wire includes:
   a plurality of first capacitor contact wires extending from each of the first and second potential power supply wires in the first layer toward the power supply wires having different potentials in the second layer; and
   a plurality of second capacitor contact wires extending from each of the first and second potential power supply wires in the second layer and arranged alternately with the plurality of first capacitor contact wires.

3. The semiconductor integrated circuit device according to claim 1, wherein the at least one capacitance contact wire includes:
   a plurality of capacitor contact wires extending from the portions of the first and second potential power supply wires exclusive of the bent middle portions in the first layer toward the portions of the power supply wires exclusive of the bent middle portions having different potentials in the second layer.

4. A semiconductor integrated circuit device comprising:
   a plurality of power supply wire layers including a first layer and an adjacent second layer, with the first layer and the second layer each including a plurality of first potential power supply wires and a plurality of second potential power supply wires, wherein the first potential power supply wires in the first layer form an intralayer capacitor with the second potential power supply wires in the first layer; and
   a plurality of capacitor contact wires extending parallel to one another between the first layer and the second layer, each capacitor contact wire forming a capacitor with its surrounding capacitor contact wires and forming a capacitor with each of the power supply wires in the first layer and the power supply wires having different potentials in the second layer, wherein:
   the first potential power supply wires include a plurality of meandered first potential power supply wires, each having a bent middle portion, and the second potential power supply wires include a plurality of meandered second potential power supply wires, each having a bent middle portion, with the plurality of meandered first potential power supply wires and the plurality of meandered second potential power supply wires arranged alternately in each of the power supply wire layers;
   the bent middle portions of the first and second potential power supply wires in the first layer and the bent middle portions of power supply wires having the same potential in the second layer are opposed to each other and connected to each other by a plurality of contact wires;
   the first potential power supply wires and the second potential power supply wires have portions exclusive of the bent middle portions that are respectively opposed to power supply wires having different potentials in the second layer; and
   the at least one capacitor contact wire includes a plurality of capacitor contact wires extending from each of the first and second potential power supply wires in the first layer toward the power supply wires having different potentials in the second layer.

5. The semiconductor integrated circuit device according to claim 4, wherein, each of the capacitor contact wires includes:
   a basal end connected to either one of the first potential power supply wire and the second potential power supply wire in the first layer; and
   a distal end separated from the other one of the first potential power supply wire and the second potential power supply wire in the second layer, a capacitor being formed between the distal end of each capacitor contact wire and the other one of the first potential power supply wire and the second potential power supply wire in the second layer.

6. The semiconductor integrated circuit device according to claim 5, wherein the plurality of capacitor contact wires include:

a plurality of capacitor contact wires having a first potential and extending from the first potential power supply wires in the first layer and the second layer; and a plurality of capacitor contact wires having a second potential and extending from the second potential power supply wires in the first layer and the second layer, wherein each of the capacitor contact wires is surrounded by a plurality of the capacitor contact wires having different potentials, and each of the capacitor contact wires forms a capacitor with the plurality of surrounding capacitor contact wires.

* * * * *